(12) United States Patent
Schönholz

(10) Patent No.: US 12,336,103 B2
(45) Date of Patent: *Jun. 17, 2025

(54) PREPREGS AND LAMINATES HAVING A UV CURABLE RESIN LAYER

(71) Applicant: ISOLA USA CORP., Chandler, AZ (US)

(72) Inventor: Roland Schönholz, Schopfheim (DE)

(73) Assignee: Isola USA Corp., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/088,059

(22) Filed: Dec. 23, 2022

(65) Prior Publication Data

US 2023/0127186 A1 Apr. 27, 2023

Related U.S. Application Data

(60) Division of application No. 16/853,722, filed on Apr. 20, 2020, now Pat. No. 11,558,962, which is a continuation of application No. 15/403,253, filed on Jan. 11, 2017, now Pat. No. 10,631,412, which is a division of application No. 14/838,092, filed on Aug.

(Continued)

(51) Int. Cl.
| | |
|---|---|
| H05K 3/30 | (2006.01) |
| B32B 5/02 | (2006.01) |
| B32B 5/26 | (2006.01) |
| H05K 1/18 | (2006.01) |

(Continued)

(52) U.S. Cl.
CPC ............. *H05K 1/186* (2013.01); *B32B 5/024* (2013.01); *B32B 5/26* (2013.01); *H05K 3/284* (2013.01); *H05K 3/4611* (2013.01); *B32B 2260/023* (2013.01); *B32B 2260/046* (2013.01); *B32B 2262/101* (2013.01); *B32B 2305/77* (2013.01); *B32B 2307/41* (2013.01); *B32B 2307/412* (2013.01); *B32B 2457/08* (2013.01); *H05K 2201/0195* (2013.01)

(58) Field of Classification Search
CPC ...... H05K 1/186; H05K 3/284; H05K 3/4611; H05K 2201/0195; B32B 5/024; B32B 5/26; B32B 2660/023; B32B 2660/046; B32B 2262/101; B32B 2305/77; B32B 2307/41; B32B 2307/412; B32B 2457/08
See application file for complete search history.

(56) References Cited

U.S. PATENT DOCUMENTS

| | | |
|---|---|---|
| 4,255,481 A | 3/1981 | Dinella et al. |
| 5,622,588 A | 4/1997 | Weber |
| (Continued) | | |

FOREIGN PATENT DOCUMENTS

| | | |
|---|---|---|
| EP | 0 488 574 A2 | 6/1992 |
| EP | 0 689 245 A2 | 12/1995 |
| (Continued) | | |

*Primary Examiner* — Daniel McNally
(74) *Attorney, Agent, or Firm* — McDonnell Boehnen Hulbert & Berghoff LLP

(57) ABSTRACT

Prepregs having a UV curable resin layer located adjacent to a first thermally curable resin layer or sandwiched between first and second thermally curable resin layers wherein the UV curable resin layer is uncured or partially cured as well as methods for preparing laminates using the prepregs wherein the laminate includes at least one UV curable resin encapsulated electrical component.

10 Claims, 2 Drawing Sheets

Related U.S. Application Data

27, 2015, now Pat. No. 9,579,868, which is a continuation of application No. PCT/US2015/038483, filed on Jun. 30, 2015.

(60) Provisional application No. 62/019,554, filed on Jul. 1, 2014.

(51) Int. Cl.
*H05K 3/28* (2006.01)
*H05K 3/46* (2006.01)

(56) References Cited

U.S. PATENT DOCUMENTS

| | | |
|---|---|---|
| 6,586,110 B1 | 7/2003 | Obeshaw |
| 9,579,868 B2 * | 2/2017 | Schönholz ............... B32B 5/26 |
| 11,558,962 B2 * | 1/2023 | Schönholz ............... B32B 5/26 |
| 2002/0162685 A1 | 11/2002 | Gotro et al. |
| 2006/0160373 A1 | 7/2006 | Kowalski et al. |
| 2009/0242248 A1 | 10/2009 | Sohn et al. |
| 2010/0044887 A1 | 2/2010 | Fukuda et al. |
| 2011/0018127 A1 | 1/2011 | Lee |
| 2012/0048605 A1 | 3/2012 | Chung |
| 2013/0155639 A1 | 6/2013 | Ogawa et al. |
| 2014/0085854 A1 | 3/2014 | Tsuyutani et al. |

FOREIGN PATENT DOCUMENTS

| | | |
|---|---|---|
| KR | 20130033851 A | 4/2013 |
| WO | 2012067003 A1 | 5/2012 |

* cited by examiner

PREPREGS AND LAMINATES HAVING A UV CURABLE RESIN LAYER

This application is a divisional application of U.S. patent application Ser. No. 16/853,722, filed on Apr. 20, 2020, which is a continuation application of U.S. patent application Ser. No. 15/403,253, filed on Jan. 11, 2017, which is a divisional of U.S. patent application Ser. No. 14/838,092, filed on Aug. 27, 2015, now U.S. Pat. No. 9,579,868, issued Feb. 28, 2017, which is a continuation of International application no. PCT/US2015/38483, filed on Jun. 30, 2015, which in turn claims benefit of U.S. provisional application No. 62/019,554, filed on Jul. 1, 2014, the disclosures of each of which are incorporated herein by reference.

BACKGROUND OF THE INVENTION

(1) Field of the Invention

This invention concerns prepregs having a UV curable resin layer and to methods of using the prepregs to manufacture printed circuit board having embedded electrical components.

(2) Description of the Art

In order to protect circuit board electronic components from damage during the pressures and/or temperatures reached during lamination steps in printed circuit board manufacturing processes, it is sometimes desirable to milling a "window" in an adjacent layer to form a protective structure in which an electronic component associated with a laminate or prepreg layer resides during lamination. A problem with this approach is that the prepreg layer adjacent to the electronic component and window can be thin and provide an insufficient amount of resin to fill the window and encapsulate the electronic component during a lamination step. There is a need, therefore, for new products and methods that allow electronic components to be protected during printed circuit board lamination steps with improved encapsulation results.

SUMMARY OF THE INVENTION

One aspect of this invention is a prepreg that may be used to manufacture printed circuit boards or printed circuit board intermediate laminates that have embedded electronic components where the prepreg includes a UV curable resin layer located between a first thermally curable resin and an optional second thermally curable resin layer.

In another aspect, this invention is a prepreg including a UV curable resin layer located between a first thermally curable resin layer that is at least partially cured and a second thermally curable resin layer that is at least partially cured wherein the first and second thermally curable resin layers have a thickness of from about 5 µm to about 40 µm and more preferably about 5 µm to about 15 µm and the UV curable resin layer has a thickness of from about 10 µm to about 500 µm.

A method for embedding an electronic device in a printed circuit board layer comprising the steps of: applying a mask layer to a prepreg having a first thermally curable resin layer that is at least partially cured, a second thermally curable resin layer that is at least partially cured and a UV curable resin layer positioned between the first thermally curable resin layer and the second thermally curable resin layer wherein the mask layer is applied to an exposed surface to one of the first thermally curable resin layer or the second thermally curable resin layer and wherein the mask layer has at least one UV light opaque portion and at least one UV light transparent portion;
   directing UV light at the UV mask layer for a time sufficient to cure the UV curable resin layer below the UV light transparent portion of the prepreg to form a partially UV cured prepreg including an uncured UV curable resin portion located below the UV light opaque portion of the mask layer and a cured UV curable resin portion located below the UV light transparent portion of the mask layer;
   placing a planar structured inner layer having a first and second surface and including at least one electrical component that is located on a first surface of the structured inner layer into contact with the first thermally curable resin layer such that the at least one electrical component is in registration with the at least one uncured UV curable resin portion to form a stack; and
   subjecting the stack to laminating conditions including temperatures and pressures sufficient to cause the UV light curable resin layer portion and the partially cured thermally curable resin of the first thermally curable resin layers become liquid, flow around the electrical component and substantially fill gaps between the prepreg and the structured inner layer to form a laminate having at least one embedded electrical component.

DESCRIPTION OF CURRENT EMBODIMENTS

Figure 1:
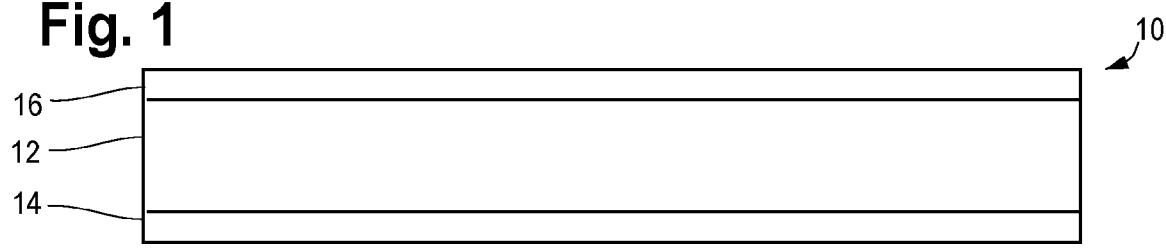
FIG. 1 is a side view of a prepreg (10) of this invention including a UV curable resin layer (12) located between a first thermally curable (thermosetting) resin layer (14) that is at least partially cured (b-staged) and a second thermally curable resin layer (16) that is as least partially cured.

The present invention relates to prepregs (10) (e.g., FIG. 1) including a UV curable resin layer (12) located between a first thermally curable (thermosetting) resin layer (14) that is at least partially cured and a second thermally curable resin layer (16) that is at least partially cured. The UV curable resin layer may be of any useful thickness, i.e., thick enough to cause a sufficient amount of melted resin to flow and fill gaps created way when the electrical components associated with structured inner layer are embedded in the UV curable resin layer during lamination. In addition, the UV curable resin layer can have a thickness that is greater than the height of the electronic component that is intended to be protected by embedding it in the UV curable resin layer. The UV curable resin layer will typically have a thickness ranging from about 10 µm to about 500 µm, more typically from about 20 µm to about 200 µm.

Any UV curable resin (or photopolymer) that is capable of becoming at least partially liquid and flowable under normal printed circuit board laminating conditions may be used. Examples of useful UV curable resins include, but are not limited to Ultraviolet (UV) and electron beam (EB) energy-cured materials such as urethanes acrylates, polyester acrylates, amino acrylates and epoxy acrylates. In addition, the UV curable materials may include photoinitiators and additives that enhance the performance of the pre and post cured materials.

The properties of a photocured material, such as flexibility, adhesion, and chemical resistance can be provided by functionalized oligomers present in the photocurable composite. As noted above, oligomer photopolymers are typically epoxides, urethanes, polyethers, or polyesters, each of which provides specific properties to the resulting material. Each of these oligomers is typically functionalized by an acrylate. An example shown below is an epoxy oligomer that has been functionalized by acrylic acid. Acrylated epoxies are useful as coatings on metallic substrates, and result in glossy hard coatings.

include epoxy resins, cyanurate resins, bismaleimide resins, polyimide resins, phenolic resins, furan resins, xylene formaldehyde resins, ketone formaldehyde resins, urea resins, melamine resins, aniline resins, alkyd resins, unsaturated polyester resins, diallyl phthalate resins, triallyl cyanurate resins, triazine resins, polyurethane resins, silicone resins and any combination or mixture thereof.

In one aspect of this invention, the thermally curable resin is or includes an epoxy resin. Some examples of useful epoxy resins include phenol type epoxy resins such as those based on the diglycidyl ether of bisphenol A, on polyglycidyl ethers of phenol-formaldehyde novolac or cresol-formaldehyde novolac, on the triglycidyl ether of tris(phydroxyphenol) methane, or on the tetraglycidyl ether of tetraphenylethane; amine types such as those based on tetraglycidyl-methylenedianiline or on the triglycidyl ether of paminoglycol; cycloaliphatic types such as those based on 3,4-epoxycyclohexylmethyl-3,4-epoxycyclohexane carboxylate. The term "epoxy resin" also stands for reaction products of compounds containing an excess of epoxy (for instance, of the aforementioned types) and aromatic dihydroxy compounds. These compounds may be halogen-substituted. Preference is given to epoxy-resins which are derivative of bisphenol A, particularly FR-4. FR-4 is made by an advancing reaction of an excess of bisphenol A diglycidyl ether with tetrabromobisphenol A. Mixtures of epoxy resins with bismaleimide resin, cyanate resin and/or bismaleimide triazine resin can also be applied.

The thermally curable resin compositions, in addition to a base resin will typically include initiators or catalysts, one or more optional flame retardants and solvents. The flame retardant may be any flame retardant material that is known to be useful in resin compositions used to manufacture prepregs and laminates use to manufacture printed circuit boards. The flame retardant(s) may contain halogens or they may be halogen free.

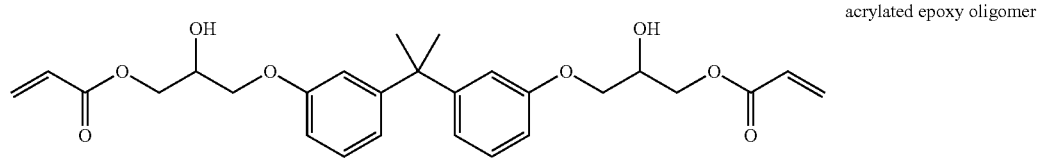 [SMILES: C=CC(=O)OCC(O)COc1cccc(C(C)(C)c2cccc(OCC(O)COC(=O)C=C)c2)c1]

acrylated epoxy oligomer

Acrylated urethane oligomers are typically abrasion resistant, tough, and flexible making ideal coatings for floors, paper, printing plates, and packaging materials. Acrylated polyethers and polyesters result in very hard solvent resistant films, however, polyethers are prone to UV degradation and therefore are rarely used in UV curable material. Often formulations are composed of several types of oligomers to achieve the desirable properties for the material.

As noted above, prepreg (10) will include an at least partially cured (b-staged) first thermally curable resin layer (14) and an optional second at least partially cured thermally curable resin layer (16). Each of these layers will typically have a thickness of from about 5 µm to about 40 µm and more preferably from about 5 µm to about 15 µm. The thickness of the first and second thermally curable resin layers (14, 16) may be the same or different.

The first and second thermally curable resin layers may be made from resins, resin systems or mixtures of resins that are commonly used in the manufacture of printed circuit boards. The resin(s) will typically be a thermoset or thermoplastic resin. Non-limiting examples of useful resins Alternatively, or in addition, the thermally curable resins may include halogens such as bromine in their backbone structure to impart the cured resin with flame retardant properties. The resin compositions may also include polymerization initiators or catalysts.

Examples of some useful initiators or catalysts include, but are not limited to peroxide or azo-type polymerization initiators (catalysts). In general, the initiators/catalysts chosen may be any compound that is known to be useful in resin synthesis or curing whether or not it performs one of these functions.

The resin compositions will include one or more solvents which are typically used to solubilize the appropriate resin composition ingredients and/or to control resin viscosity and/or in order to maintain the resin ingredients in a suspended dispersion. Any solvent known by one of skill in the art to be useful in conjunction with thermosetting resin systems can be used. Particularly useful solvents include methylethylketone (MEK), toluene, dimethylformamide (DMF), or mixtures thereof.

During the manufacturing process, the reinforcing materials are impregnated with or otherwise associated with the resin compositions and some or most of the solvent is removed from the resin compositions to form b-staged prepregs and c-staged laminates. Thus, when resin composition or laminate weight percent amounts are listed herein, they are reported on a dry-solvent free-basis unless otherwise noted.

The resin compositions may include a variety of other optional ingredients including fillers, tougheners, adhesion promoters, defoaming agents, leveling agents, dyes and pigments. For example, a fluorescent dye can be added to the resin composition in a trace amount to cause a laminate prepared therefrom to fluoresce when exposed to UV light in a board shop's optical inspection equipment. Other optional ingredients known by persons of skill in the art to be useful in resins that are used to manufacture printed circuit board laminates may also be included in the resin compositions of this invention.

Referring again to FIG. 1 there is shown a side view of a prepreg (10) of this invention including a UV curable resin layer (12) located between an at least partially cured first thermally curable resin layer (14) and an at least partially cured second thermally curable resin layer (16). In some embodiments, the thermally curable resin layers that a mask layer is not applied to during the methods described below can be fully cured. The thickness of the curable resin layers should be great enough to provide a reservoir of thermally curable resin that is sufficient, alone or in combination with the UV curable resin to cover electrical component (26) and circuit traces (28) during the lamination process. In some embodiments, the prepreg can include a core material such as a woven glass cloth material.

Figure 2:
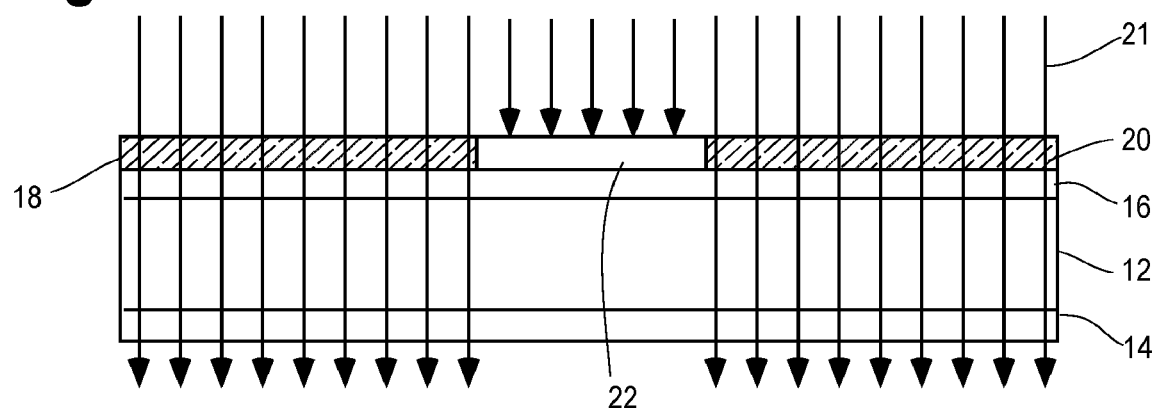
FIG. 2 is a side view of the prepreg of FIG. 1 including a mask layer (18) having a UV light transparent portion (20) and a UV light opaque portion (22)

FIG. 2 is a side view of the prepreg of FIG. 1 including a mask layer (18) having a UV light transparent portion (20) and a UV light opaque portion (22). In FIG. 2, UV light (21) having a wavelength that is selected to cure the UV curable resin is directed at mask layer (18) covering or both of the first and/or second thermally curable resin layers. The UV light passes through transparent portion (20) of mask (18) and cures the UV curable resin that underlies transparent portion (20). UV light is not able to pass through opaque portion (22) of mask (18) with the result that UV curable resin that lies below mask opaque portion (22) remains uncured. In one embodiment of this invention not shown in the Figures, two masks that are mirror images of each other can be applied to the surfaces of each of opposing thermally curable resin layers (12) and (14) and the UV curing step can accomplished by directing UV light at both planar surfaces of the prepreg. In another embodiment, the two opposing masks are not mirror images of one another.

Figure 3:
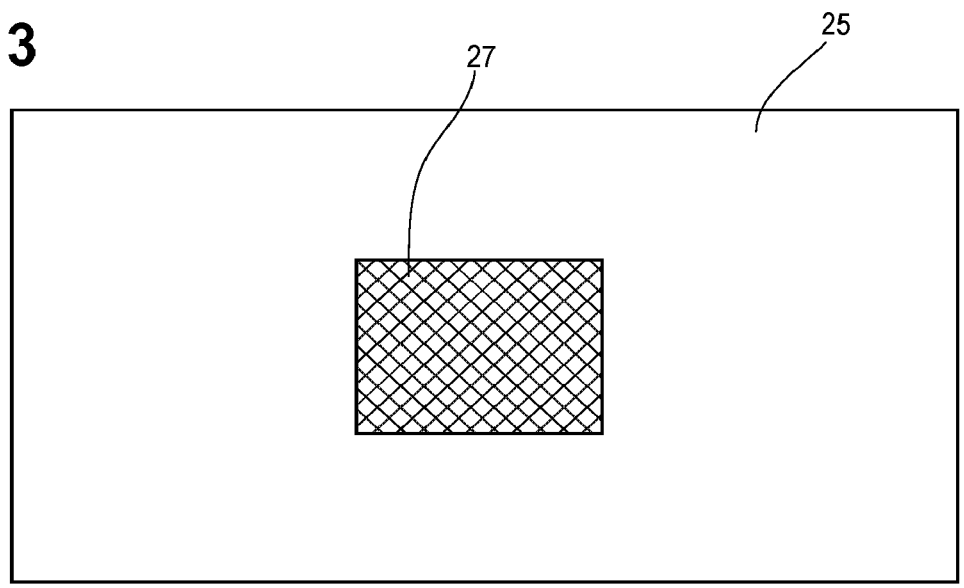
FIG. 3 is a top view of the UV curable resin layer (12) of the prepreg of FIG. 2 after the prepreg has been exposed to UV light wherein the UV curable resin layer has become at least partially polymerized in the area covered by UV light transparent portion (20) and wherein the UV curable resin layer remains unpolymerized (uncured) in the area below the UV light opaque portion of mask layer (18)
Figure 4:
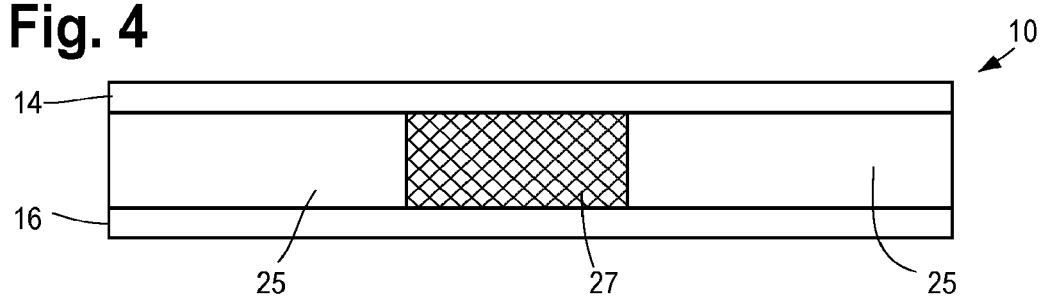
FIG. 4 is a side view of the prepreg of FIG. 3.

The partially UV cured prepreg resulting from the UV curing step represented by FIG. 2 is shown in FIGS. 3 and 4. In FIGS. 3 and 4, the partially UV cured prepreg, includes a UV curable resin layer (12) that includes a least one cured UV resin portion (25) that underlies the UV light transparent portion(s) (20) of mask layer (18) and at least one uncured UV resin portion (27) that underlies the opaque portion(s) of mask layer (18). The at least one uncured UV curable resin portion (27) forms the "window" in which a sensitive electronic device or component can be urged during later lamination steps.

Figure 5:
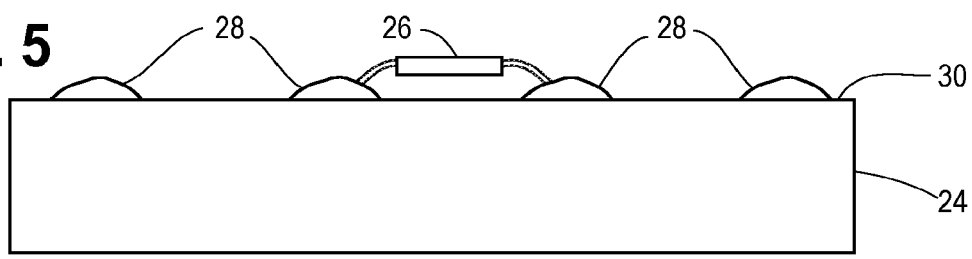
FIG. 5 is a side view of a structured inner layer (24) including an electrical component (26) that is soldered to a circuit trace (28) located on a first surface (30) of structured inner layer (24)

FIG. 5 is a side view of a structured inner layer (24) including an electrical component (26) that is soldered to a circuit trace (28) located on a first surface (30) of structured inner layer (24). Structured inner layer (24) may be made from components and by methods that are within the knowledge of one skilled in circuit board manufacturing. Structured inner layer (24) may be a partially or fully cured resin layer having a surface upon which circuit traces (28) are etched or vias are applied and if further includes at least one electrical component (28) that is attached to a circuit trace(s) and/or via(s). Electrical component (28) may be any electrical component such as a chip, resistor, transistor and the like that the board manufacture wishes to protect during lamination of layers in the manufacture of printed circuit boards. In many cases, structured inner layer will include a plurality of electrical components where some of the electrical components do not need to be protected during board laminations. Thus, for purposes of this invention, the term "electrical component(s)" refers only to those electrical components that are being embedded in the methods described herein.

Figure 6:
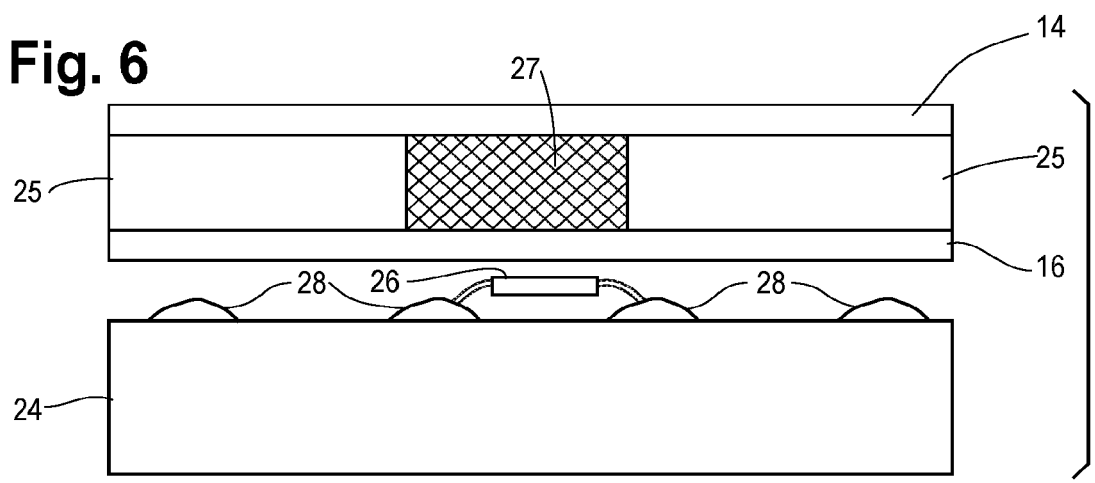
FIG. 6 is a side view of the lamination of the prepreg of FIG. 4 with the structured inner layer (24) of FIG. 5 wherein, during the lamination process, the uncured UV curable resin portion and the partially cured thermally curable resin of one of the first or second thermally curable resin layers that abuts structured inner layer (24) become liquid and flow around the electrical component and fill all gaps (30) between the prepreg of FIG. 4 and the structured inner layer (24) of FIG. 5.

FIG. 6 is a side view showing the lamination of the partially UV cured prepreg of FIG. 4 with the structured inner layer (24) of FIG. 5. During the lamination process the partially UV cured prepreg is placed over (or under) structured inner layer (24) such that the second at least partially cured thermally curable resin layer (16) abuts the electrical component and circuit trace features of the structured inner layer. It should be noted that the structure inner layer could alternatively be associated with the first at least partially cured thermally curable resin layer. In the orientation shown in FIG. 6, the at least one uncured UV resin portion (27) of the partially UV cured prepreg overlies (is in registration with) electrical component (26) to form a stack. It is desirable that the at least one uncured UV resin portion (27) is larger in all dimensions than electrical component (26) that it overlies. In certain embodiments, the partially UV cured prepreg can include multiple distinct uncured UV resin portions each of which overlie distinct electrical components attached to structured inner layer (24).

Next, the stack is heated and pressure is optionally applied to the stack to cause the second partially cured thermal resin layer (16) and optionally the UV hardened resin portion(s) to become flowable. Applying pressure to the stack causes the flowable resin(s) to flow around the electrical component and fill all gaps between the UV cured prepreg and the structured inner layer. Maintaining the heat and pressure on the stack fully cures the partially cured thermal resin to form c-staged resin layers (36, 38).

Figure 7:
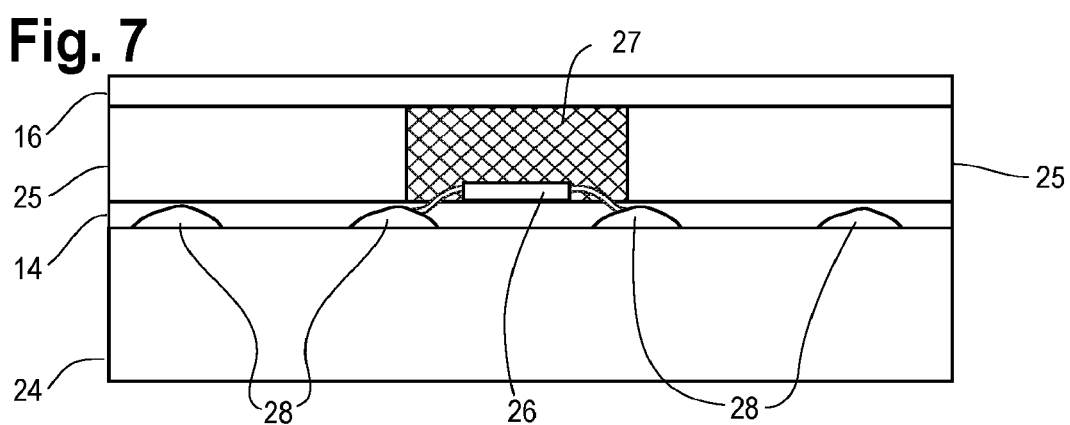
FIG. 7 is a laminate that results from the lamination step shown in FIG. 6.

In the resulting laminate shown in FIG. 7, electrical component (26) becomes at least partially embedded in the uncured UV resin portion (27). This provides several potential advantages including good encapsulation of the electrical component in the laminate and/or reducing the thickness of the resulting laminate. Good encapsulation is achieved when the at least one electrical component is protected from damage by the pressures and/or temperatures reached in subsequent lamination steps-if any. The resulting laminate product can be used as is or it can be used as a layer in subsequent printed circuit board manufacturing and lamination steps.

At this stage, the final laminate includes an uncured UV resin portion(s) (25). Uncured UV resin portion(s) (25) can remain uncured in the final laminate. Alternatively, if the laminate is transparent or at least partially transparent to UV light, the uncured UV resin portion can be cured by the application of UV light to the final laminate. By partially transparent we mean enough UV light can pass through the material layer to at least partially cure the underlying UV curable resin.

Prepregs and Laminates

The thermosetting resins and UV curable resins described above are useful for preparing prepregs shown in side-view in FIG. 1. In order to be useful in manufacturing printed circuit boards a varnish including one or more resins and other optional ingredients can be formulated, formed into a sheet, and partially cured—or b-staged—to form prepreg sheets. As prepregs, the sheets can be laid up with additional material sheets to form a "stack" of multiple material sheets which can be further cured and or laminated to form a fully cured by heat and/or pressure lamination as described above.

Prepregs (10) can be manufactured in batch or in continuous processes. For example, sheets of partially cured (b-staged) thermally curable resins can be prepared and then a UV curable resin can be located between two sheets of b-staged resin to form prepreg (10). Prepregs (10) are optionally manufactured using a core material such as a roll of woven glass web (fabric) which is unwound into a series of drive rolls. The web then passes into a coating area where the web is passed through a tank which contains the thermosetting resin system of this invention, solvent and other components where the glass web becomes saturated with the resin. The saturated glass web is then passed through a pair of metering rolls which remove excess resin from the saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll. The woven glass web can be replaced with a woven fabric material, paper, plastic sheets, felt, and/or particulate materials such as glass fiber particles or particulate materials. In this embodiment the prepreg should include only one b-staged thermally curable resin layer that includes a core material unless the core material used is transparent to UV light of the type used to cure the UV curable resin material. If the b-staged thermally curable resin layer includes a UV opaque core material, then the mask should be applied to the opposing UV light transparent b-staged thermally curable resin layer.

In another process for manufacturing prepregs, thermosetting resins (thermally curable resins) are premixed in a mixing vessel under ambient temperature and pressure. The viscosity of the pre-mix can be adjusted by adding or removing solvent from the resin. The thermosetting resin (varnish) mix can be used to manufacture prepreg sheets and it can also be applied in a thin layer to a Cu foil substrate (RCC—resin coated Cu) using slot-die or other related coating techniques. Thus, it is possible that the prepregs of this invention can include on one surface a partially cured thermally curable resin layer having a copper foil surface. If necessary some or all of the copper foil sheet can be removed to expose the underlying UV curable resin to a UV light source. Indeed, the copper layer can be used as the mask layer and portions of the copper layer can be removed to form UV light transparent portions of the prepreg.

The term "UV curable resin" is used herein to refer to a type of resin—a resin that becomes cured upon exposure to UV light. The term is not intended to indicate the degree of cure of the resin-cured vs. uncured.

The foregoing description of the specific embodiments will reveal the general nature of the disclosure so others can, by applying current knowledge, readily modify and/or adapt for various applications such specific embodiments without departing from the generic concept, and therefore such adaptations and modifications are intended to be comprehended within the meaning and range of equivalents of the disclosed embodiments. It is to be understood that the phraseology or terminology herein is for the purpose of description and not of limitation.

What is claimed is:

1. A prepreg comprising:
    a first thermally curable resin layer;
    a second thermally curable resin layer; and
    a UV curable resin layer between the first thermally curable resin layer and the second thermally curable resin layer.

2. The prepreg of claim 1 wherein at least one of the first thermally curable resin layer and the second thermally curable resin layer are b-staged thermally curable resin layers.

3. The prepreg of claim 2 wherein both the first thermally curable resin layer and the second thermally curable resin layer are b-staged.

4. The prepreg of claim 1 wherein the first thermally curable resin layer and the second thermally curable resin layers each have a thickness of from about 5 µm to about 40 µm.

5. The prepreg of claim 1 wherein the first thermally curable resin layer and the second thermally curable resin layer each have a thickness of about 5 µm to about 15 µm.

6. The prepreg of claim 1 wherein the UV curable resin layer has a thickness of from about 10 µm to about 500 µm.

7. The prepreg of claim 1 wherein the UV curable resin layer has a thickness of from about 20 µm to about 200 µm.

8. The prepreg of claim 1 wherein one of the first thermally curable resin layer and second thermally curable resin layer is a c-staged thermally curable resin layer.

9. The prepreg of claim 1 wherein the first thermally curable resin layer includes a copper coated surface.

10. A prepreg comprising:
    a first thermally curable resin layer that is at least partially cured;
    a second thermally curable resin layer that is at least partially cured; and
    a UV curable resin layer between the first thermally curable resin layer and the second thermally curable resin layer wherein the first curable resin layer and the second curable resin layer each have a thickness of from about 5 µm to about 40 µm and the UV curable resin layer has a thickness of from about 10 µm to about 500 µm.

* * * * *